(12) United States Patent
Makifuchi et al.

(10) Patent No.: US 6,932,665 B2
(45) Date of Patent: Aug. 23, 2005

(54) METHOD OF MANUFACTURING ORGANIC EL DISPLAY AND COLOR CONVERSION FILTER SUBSTRATE

(75) Inventors: Youichi Makifuchi, Kanagawa (JP); Kenya Sakurai, Kanagawa (JP); Yukinori Kawamura, Kanagawa (JP)

(73) Assignee: Fuji Electric Co., Ltd., Kawasaki (JP)

( * ) Notice: Subject to any disclaimer, the term of this patent is extended or adjusted under 35 U.S.C. 154(b) by 68 days.

(21) Appl. No.: 10/625,620

(22) Filed: Jul. 24, 2003

(65) Prior Publication Data

US 2005/0020174 A1 Jan. 27, 2005

(51) Int. Cl.$^7$ .............................................. H05B 33/10
(52) U.S. Cl. ............................. 445/24; 427/162; 427/66
(58) Field of Search ............................... 427/64, 66, 68, 427/162, 164, 165; 445/24, 25

(56) References Cited

U.S. PATENT DOCUMENTS

| | | | | |
|---|---|---|---|---|
| 6,284,307 B1 | * | 9/2001 | Fukuzawa et al. | ............. 427/66 |
| 6,304,384 B1 | * | 10/2001 | Nishikawa | .................. 427/162 |
| 6,627,125 B1 | * | 9/2003 | Nishikawa | .................. 427/162 |
| 2004/0135502 A1 | * | 7/2004 | Kobayashi et al. | ......... 313/506 |

FOREIGN PATENT DOCUMENTS

| | | | | |
|---|---|---|---|---|
| JP | 09082475 A | * | 3/1997 | ........... H05B/33/22 |
| JP | 11-251059 | | 9/1999 | |
| JP | 11265784 A | * | 9/1999 | ........... H05B/33/02 |
| JP | 11-297477 | | 10/1999 | |
| JP | 2000-77191 | | 3/2000 | |
| JP | 2003103895 A | * | 4/2003 | ............. B41M/1/34 |
| JP | 2003308975 A | * | 10/2003 | ........... H05B/33/12 |

* cited by examiner

Primary Examiner—Mariceli Santiago
(74) Attorney, Agent, or Firm—Manabu Kanesaka

(57) ABSTRACT

An organic EL display is formed by preparing an organic EL device substrate, and a combination of a transparent substrate and color conversion filter layers. An overcoat layer with a pillar is formed in a pillar mold formed by a stripping layer and a temporary substrate, and is adhered to the combination of the transparent substrate and the color conversion filter layer while curing the overcoat layer with the pillar at a predetermined temperature. The stripping layer is removed to detach the temporary substrate from the overcoat layer with the pillar. Finally, the overcoat layer with the pillar attached to the combination of the transparent substrate and the color conversion filter layers is attached to the organic EL device substrate.

13 Claims, 4 Drawing Sheets

METHOD OF MANUFACTURING ORGANIC EL DISPLAY AND COLOR CONVERSION FILTER SUBSTRATE

BACKGROUND OF THE INVENTION AND RELATED ART STATEMENT

The present invention relates to a method of manufacturing a color conversion filter substrate and an organic EL display with excellent environmental resistance and productivity for displaying multi colors with high definition. More specifically, the present invention relates to a method of manufacturing a color conversion filter substrate and an organic EL display used for a display in an image sensor, personal computer, word processor, television, facsimile, audio equipment, video equipment, car navigation equipment, desk-top electronic calculator, telephone, mobile terminal equipment, industrial measuring equipment, and so on.

In recent years, the information technology has advanced greatly and the application of the technology has been expanding rapidly. In the field of a display device, there has been developed a high-definition display device with low power consumption and a high-speed response for meeting demands for mobility and displaying motion pictures.

An organic EL luminous device has excellent characteristics such as high contrast, low drive voltage, a wide view angle and a quick response time compared to liquid crystal display devices. Tang et. al reported that an organic EL luminous device formed of stacked thin films showed a high luminance of 1000 cd/m$^2$ or higher at an applied voltage of 10 V. Since the report by Tang et. al, a great effort has been made to develop a plat panel display using an organic EL luminous device for a practical use. A green monochrome organic EL display has already been commercialized, and it is expected to develop a high-definition full-color display.

As another EL device other than a laminated layer of the organic molecules, attempts have also been made to develop an EL display device composed of an organic polymer material.

There have been three major approaches as a method of displaying multiple or full colors with the organic EL display. One of the methods has been disclosed in Japanese Patent Publication (Kokai) No. 57-167487, in which light emitting elements of the three primary colors (red, green, and blue) are arranged in a matrix form. In this method, it is necessary to arrange three types of light-emitting materials (R, G, and B) in a matrix form with high precision, thereby making it technically difficult to produce such a device at a low cost. Further, the three types of light-emitting materials have different life times, thereby shifting a color of the display with time.

As the second approach, Japanese Patent Publication (Kokai) No. 01-315988 has disclosed a method in which a color filter and a backlight emitting white light are used to display the three primary colors through the filter. However, it is difficult to obtain an organic light emitting device emitting bright white light for long time, which is necessary for obtaining bright three colors R, G, and B.

As the third approach, a method has been proposed in which fluorescent materials are arranged separately in a plane and absorb light from a light emitting device to emit light in multiple colors (Japanese Patent Publication (Kokai) No. 03-152897, etc.). This method for obtaining light in multiple colors from the fluorescent materials has been practically applied to a CRT, a plasma display, and so on. This method has an advantage in which a light emitting device with high brightness can be used as a light source. For example, a color conversion method in which blue light is converted to green light and red light has been proposed (Japanese Patent Publication (Kokai) No. 8-286033, etc.). It is possible to provide a display for displaying in full colors when a color-converting layer containing the fluorescent colorants is formed in a pattern with high resolution.

In order to display a color image with the methods described above, a display device driven by a thin film transistor (TFT) has been proposed recently. In such a device, it is difficult to provide a large opening in a system where light passes through a substrate having the TFT due to a shielding effect of a wiring portion. Therefore, there has been recently developed a top emission system in which the light radiates toward a side opposite to the substrate having the TFT.

In the top emission system, light emitting elements for the primary colors, i.e. red (R), green (G) and blue (B), are arranged separately in a matrix pattern. Therefore, it is necessary to precisely arrange light emitting materials for the RGB over the matrix pattern. Accordingly, it is difficult to manufacture such a system efficiently at a low cost. Moreover, the three light emitting materials have different luminescence characteristics and driving conditions. Therefore, it is still very difficult to obtain good color reproducibility for long time.

In a system where a backlight emits white light and a color filter is used to obtain the three primary colors, it is difficult to improve efficiency of the backlight.

In a color conversion system, fluorescent materials are arranged separately and absorb light so that the fluorescent elements emit fluorescent light in multiple colors. It is perceived that only the color conversion system can provide a high-resolution and bright organic EL display with the top emission method using the TFT drive system. Japanese Patent Publications (Kokai) No. 11-251059 and No. 2000-77191 have disclosed such color display devices.

In the case of an LCD (liquid crystal display) in which light needs to be transmitted from behind, it is necessary to make an area of the TFT, which blocks the light, as small as possible. On the other hand, in the case of an organic EL luminous device with the top emission method using the TFT drive system, the light-emitting device is located above the TFT. Therefore, it is possible to use the entire area of the substrate for forming the area of the TFT.

As a method of manufacturing such a top emission type multi-color organic EL display, there is a method in which a color conversion filter substrate is bonded to a TFT substrate on which an organic EL luminous device is formed. In this case, it is preferable to form a sealing space between the two substrates as small as possible. However, when a distance between the two substrates becomes too small, the two substrates may contact, resulting in damage of the organic EL luminous device. To resolve this problem, Japanese Patent Publication (Kokai) No. 11-297477 has disclosed an approach in which a supporting pillar as a spacer is formed on the substrate at a location other than the organic EL luminous device is formed.

As shown in FIG. 9, in a conventional color conversion filter substrate, a red color conversion filter layer 2, a green color conversion filter layer 3 and a blue color conversion filter layer 4 are arranged on a transparent supporting substrate. An overcoat layer 6 having gas barrier ability is disposed thereon as a flattening layer. The color conversion filter layers 2 (red), 3 (green) and 4 (blue) are each patterned independently in a rectangular shape. The overcoat layer 6 is formed with spin coating method or the like so as to cover the color conversion filter layers 2, 3 and 4.

It is necessary to form the overcoat layer having a thickness large enough to completely fill gaps between the color conversion layers and provide a sufficiently smooth surface. However, when the overcoat layer has too large thickness, a viewing angle is lowered. Therefore, it is important to form a thin overcoat layer while obtaining a sufficient degree of flatness.

When the overcoat layer is formed directly on the color conversion filter layers with the spin coating method or the like, the overcoat layer is formed in a very thin layer. However, due to a problem of coverage, the overcoat layer has an uneven surface with several $\mu$m undulations.

As shown in FIG. 8, in the color conversion type multicolor organic EL display with the top emission type, the color conversion filter substrate is bonded to the organic EL luminous device substrate facing with each other. It is preferable that a sealing distance between the two substrates be small, specifically 0.5 to 5 $\mu$m, similar to the overcoat layer, so that an optical path is short to prevent the viewing angle from lowering. However, there are undulations on the surface of the overcoat layer. Thus, it is difficult to maintain the sealing distance between the two substrates at a small, constant value using supporting pillars 11 as a spacer.

Moreover, when the supporting pillar is formed with the spin coating method and patterned with the photolithography method, the material utilization rate is very low as the supporting pillars are formed only in a very small area.

In view of the problems described above, it is an object of the present invention to provide a method of manufacturing a color conversion filter substrate in which a thin overcoat layer has sufficient surface smoothness. Further, the overcoat layer is provided with a projection as a supporting pillar, so that the color conversion filter substrate has a stable light emission characteristic over a long period of time.

Further objects and advantages of the invention will be apparent from the following description of the invention.

SUMMARY OF THE INVENTION

To attain the above objects, the present invention provides a method of manufacturing an organic EL display in which an organic EL luminous device substrate is bonded to a color conversion filter substrate.

In the invention, the organic EL luminous device substrate includes a substrate; a thin film transistor formed on the substrate and having a source and a drain; a first electrode formed on the thin film transistor, formed of an electrically conductive thin film material, and connected to one of the source and the drain of the thin film transistor; an organic EL luminous device; and a second electrode. The thin film transistor drives the organic EL luminous device.

In the invention, the color conversion filter substrate includes at least a transparent supporting substrate; a color conversion filter layer arranged on the supporting substrate; and a transparent overcoat layer with gas barrier ability covering the color conversion filter layer for providing a smooth surface. A supporting pillar is provided on the color conversion filter substrate for adjusting a gap therebetween, so that the overcoat layer and the second electrode are bonded to face with each other with a predetermined gap therebetween.

In the invention, a method of manufacturing an organic EL display includes the steps of forming a pillar mold in a laminate of a temporary substrate and a stripping layer; forming the overcoat layer and the pillar on the pillar mold; attaching the overcoat layer and the pillar with the pillar mold to the color conversion filter substrate; curing the overcoat layer and the pillar at a predetermined temperature; removing the stripping layer to detach the temporary substrate from the overcoat layer and the pillar; and attaching the overcoat layer and the pillar with the color conversion filter substrate to the organic EL luminous device substrate. The pillar mold is formed in the temporary substrate, and then the stripping layer is formed on the temporary substrate with the pillar mold. Alternatively, the stripping layer is formed on the temporary substrate first, and the pillar mold is formed in the stripping layer. The overcoat layer and the pillar are cured at the predetermined temperature, preferably equal to or lower than 200° C.

Another aspect of the present invention provides a method of manufacturing a color conversion filter substrate. In the invention, the color conversion filter substrate includes at least a transparent supporting substrate; a color conversion filter layer arranged on the supporting substrate; and a transparent overcoat layer with gas barrier ability covering the color conversion filter layer for providing a smooth surface and having a projecting pillar.

In the invention, a method of manufacturing a color conversion filter substrate includes the steps of forming a pillar mold in a laminate of a temporary substrate and a stripping layer; forming the overcoat layer and the pillar on the pillar mold; attaching the overcoat layer and the pillar along with the pillar mold to the color conversion filter substrate; curing the overcoat layer and the pillar at a predetermined temperature; and removing the stripping layer to detach the temporary substrate from the overcoat layer and the pillar. The pillar mold is formed in the temporary substrate, and then the stripping layer is formed on the temporary substrate with the pillar mold. Alternatively, the stripping layer is formed on the temporary substrate first, and the pillar mold is formed in the stripping layer. The overcoat layer having the pillar is cured at the predetermined temperature, preferably equal to or lower than 200° C.

In the invention, the overcoat layer may include a first overcoat layer having the supporting pillar and covering the color conversion filter layer for providing the smooth surface, and a second overcoat layer with the gas barrier ability.

In the invention, the color conversion filter layer includes fluorescent colorant layers of the three primary colors formed in a desired pattern. Alternatively, the color conversion filter layer includes one fluorescent colorant layer of at least one of the three primary colors and colored filters of the remaining primary colors formed in a desired pattern. Alternatively, the color conversion filter layer includes colored filters of the three primary colors formed in a desired pattern. Alternatively, the color conversion filter layer includes one colored filter of at least one of the three primary colors and laminates of fluorescent colorant layers and colored filters of the remaining primary colors formed in a desired pattern.

In the invention, a black mask may be provided between the fluorescent colorant layers, the colored filters, or the laminates of the fluorescent colorant layers and the colored filters. The black mask has a thickness smaller than those of these layers. The present invention is applicable to a method of manufacturing a color conversion filter substrate and an organic EL display in which a color conversion filter layer has a step portion, albeit only slight.

DETAILED DESCRIPTION OF PREFERRED EMBODIMENTS

Figure 1:
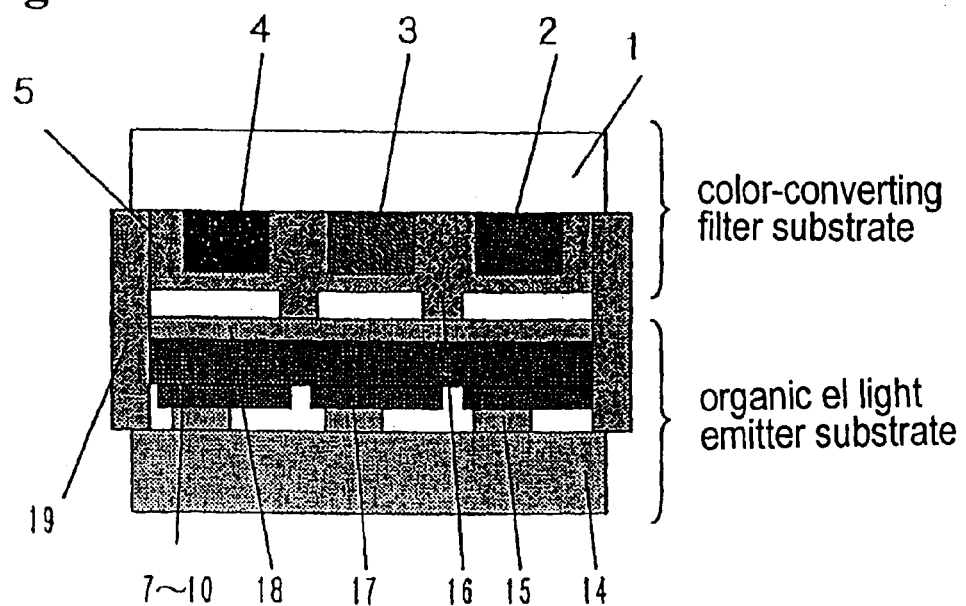
FIG. 1 is a sectional view of a top emission type multi-color organic EL display having a color conversion filter substrate obtained by a manufacturing method of the present invention.
Figure 2:
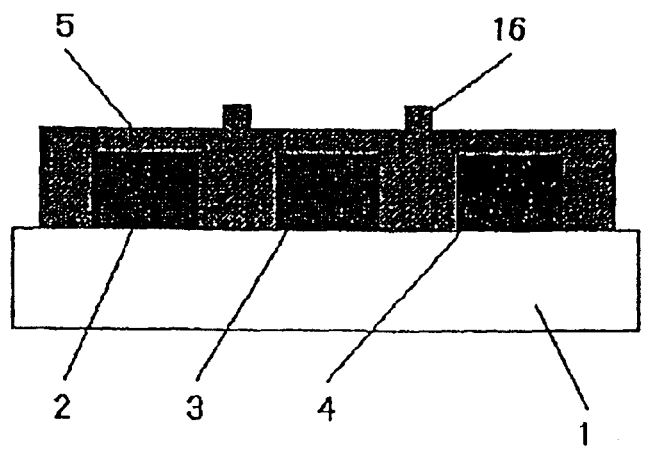
FIG. 2 is a schematic sectional view showing the color conversion filter substrate of the present invention.

Hereunder, embodiments of the invention will be explained with reference to the accompanying drawings. FIG. 1 is a sectional view of a top emission type multi-color organic EL display obtained by bonding a color conversion filter substrate to a monochrome organic EL luminous device substrate. FIG. 2 is a sectional view of a color conversion filter substrate in which red, green and blue color conversion filter layers 2, 3 and 4 containing a dye, a pigment or the like are formed on a transparent supporting substrate 1, and then an overcoat layer 5 and supporting pillars 16 are integrally formed thereon.

According to the present invention, the color conversion filter substrate includes a transparent supporting substrate 1, color conversion filter layers 2, 3 and 4 formed of a dye, a pigment and the like and disposed on the supporting substrate 1, a transparent overcoat layer 5 formed on the color conversion filter layers, and supporting pillars 16 formed on the overcoat layer 5 for functioning as a spacer when the color conversion filter substrate is bonded to an organic EL luminous device substrate.

Figure 3:
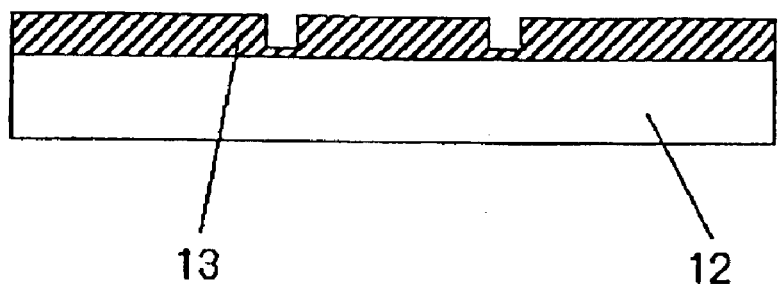
FIG. 3 is a schematic sectional view showing a temporary substrate having a stripping layer in which a supporting pillar female mold is formed.
Figure 4:
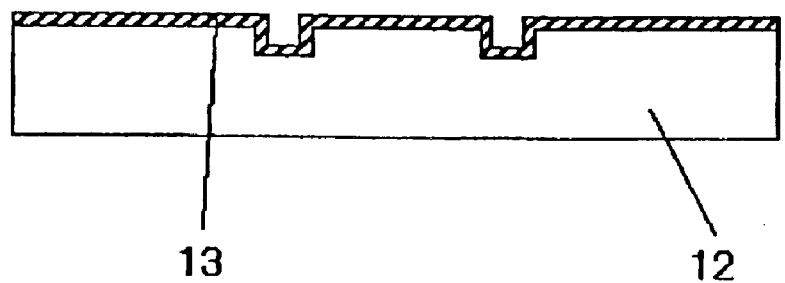
FIG. 4 is a schematic sectional view showing a temporary substrate having a supporting pillar female mold formed therein and a stripping layer disposed thereon.
Figure 5:
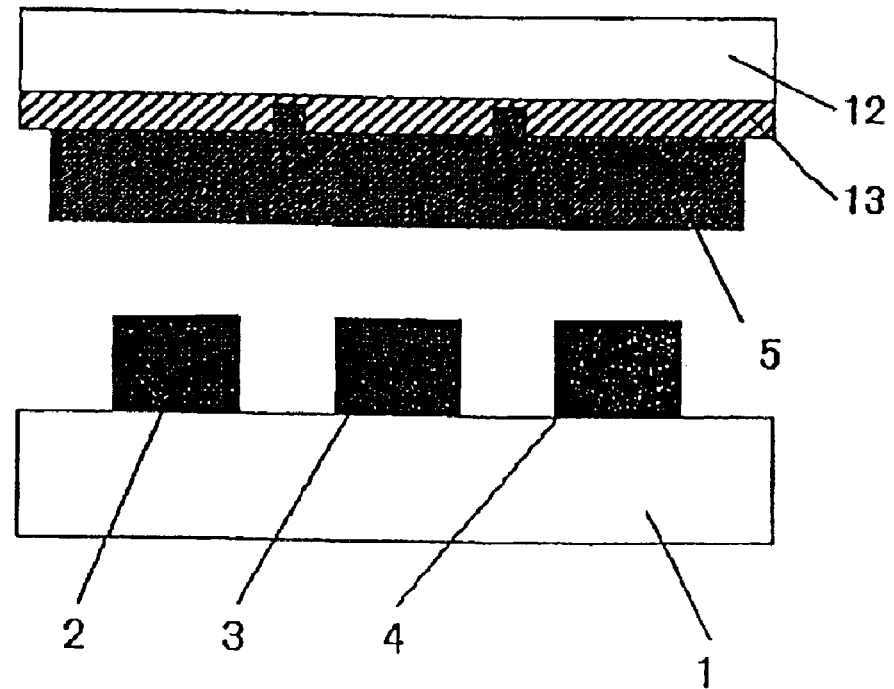
FIG. 5 is a schematic sectional view of a color conversion filter substrate for showing a method of transferring an overcoat layer and supporting pillars (before adhesion)
Figure 6:
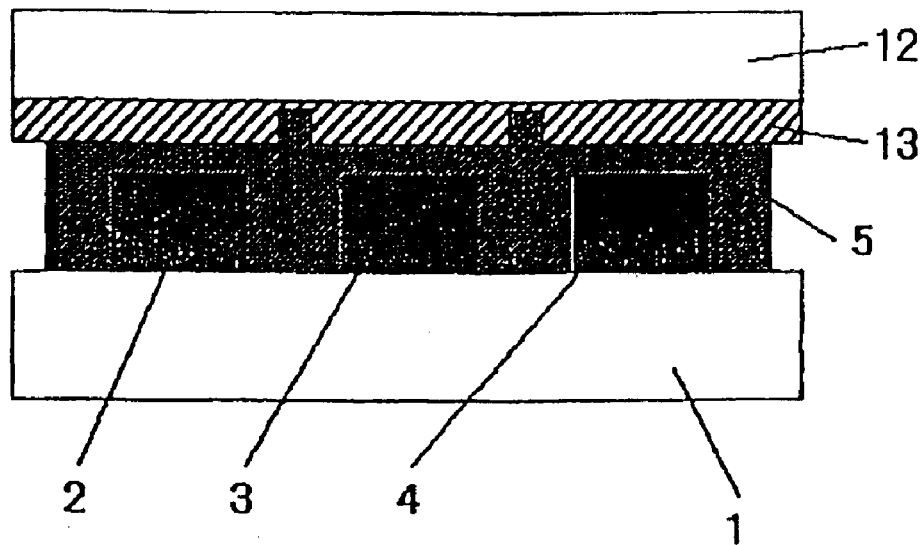
FIG. 6 is a schematic sectional view of the color conversion filter substrate for showing the method of transferring the overcoat layer and the supporting pillars (after adhesion)
Figure 7:
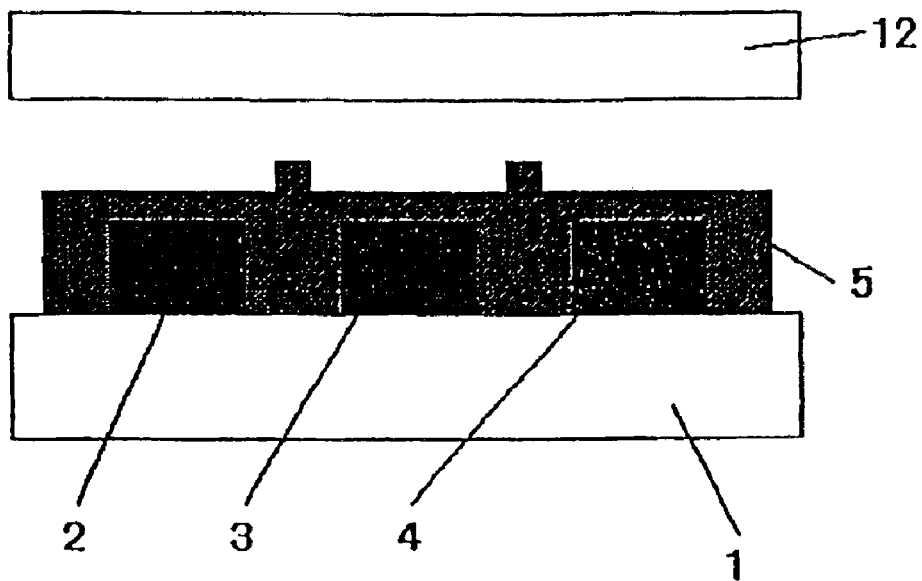
FIG. 7 is a schematic sectional view of the color conversion filter substrate for showing the method of transferring the overcoat layer and the supporting pillars (after transfer)
Figure 8:
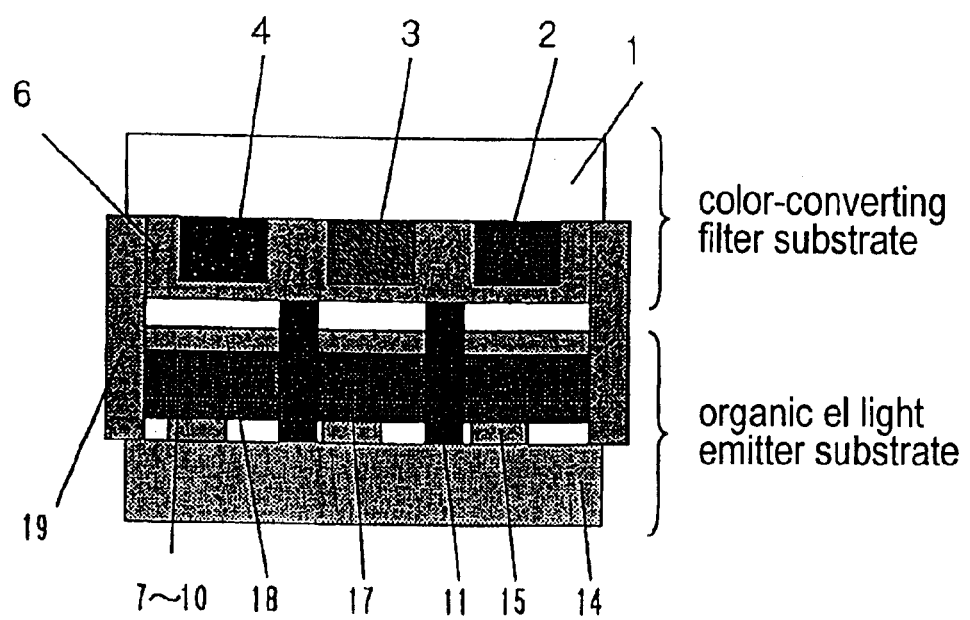
FIG. 8 is a schematic sectional view of a top emission type multi-color organic EL display having a color conversion filter substrate obtained by a conventional manufacturing method.
Figure 9:
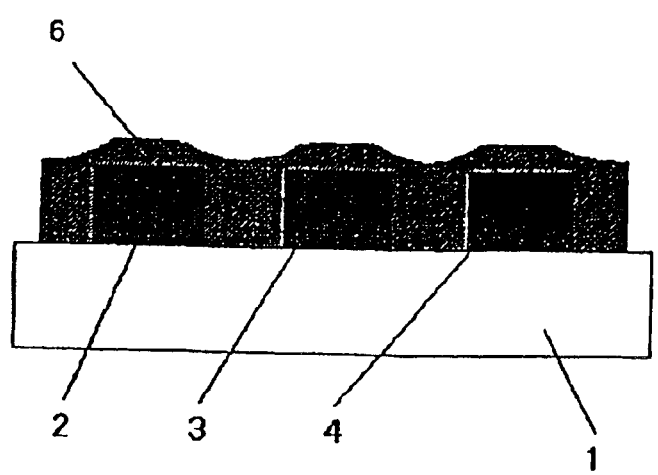
FIG. 9 is a schematic sectional view showing a conventional color conversion filter substrate.

As shown in FIG. 3, the overcoat layer 5 and the supporting pillars 16 are temporarily formed on a stripping layer 13 having a supporting pillar female mold and formed on a temporary substrate 12. Alternatively, as shown in FIG. 4, the overcoat layer 5 and the supporting pillars 16 are temporarily formed on the stripping layer 13 formed on the temporary substrate 12 having the supporting pillar female mold. Then, as shown in FIG. 5, the overcoat layer 5 and the supporting pillars 16 face the color conversion filter layers 2, 3 and 4 on the transparent supporting substrate 1. After the overcoat layer 5 and the supporting pillars 16 are bonded to the color conversion filter layers as shown in FIG. 6, the overcoat layer 5 and the supporting pillars 16 are integrally transferred on the color conversion filter layers by removing the stripping layer 13 as shown in FIG. 7.

Hereunder, a method of manufacturing the color conversion filter substrate and the organic EL display according to the present invention will be explained in more detail.

In the present invention, an organic fluorescence colorant absorbs light with a wavelength in a near-ultraviolet or visible region emitted from a luminous device, especially light with a wavelength in a blue or bluish green region, to emit another visible light. It is preferred to use one or more types of fluorescence colorants emitting at least fluorescence with a wavelength in the red region. The colorant may be combined with one or more types of fluorescence colorants emitting fluorescence with a wavelength in a green region.

It is relatively easy to obtain an organic light emitting device that emits light with a wavelength in the blue or bluish-green region as the organic EL device. When the light is converted to light with a wavelength in the red region through a simple red filter, an intensity of the light is greatly reduced due to a small amount of red light in the original light. In this case, it is possible to obtain high intensity light with a wavelength in the red region by using a fluorescence colorant to convert light from the organic light emitting device into light with a wavelength in the red region.

It is possible to obtain light with a wavelength in the green region by using another organic fluorescence colorant to convert light from the organic light emitting device into light with a wavelength in the green region. Alternatively, the light from the light emitting device may pass through a green filter to obtain green light when the light from the organic light emitting device contains a sufficient amount of light with a wavelength in the green region. As for light with a wavelength in the blue region, an organic fluorescence colorant may be used to convert light from the organic light emitting device.

The fluorescence colorants that absorb light with a wavelength in the blue or bluish-green region emitted from the luminous device to emit fluorescence with a wavelength in the red region include, for example, a rhodamine-based colorant, a cyanine-based colorant, a pyridine-based colorant, and an oxazine-based colorant. Furthermore, various dyes (direct dyes, acid dyes, basic dyes, disperse dyes, etc.) can be used provided that they are fluorescent.

The fluorescence colorants that absorb light with a wavelength in the blue or bluish-green region emitted from the luminous device to emit fluorescence with a wavelength in the green region include, for example, a coumarin-based colorant, a coumarin colorant-based dye, and a naphthalimide-based colorant. Furthermore, various dyes (direct dyes, acid dyes, basic dyes, disperse dyes, etc.) can be used provided that they are fluorescent.

The organic fluorescence colorant may be formed in an organic fluorescent pigment by blending in advance into a resin such as polymethacrylate, polyvinyl chloride, vinyl chloride-vinyl acetate copolymer, alkyd resin, aromatic sulfonamide resin, urea resin, melamine resin, benzoguanamine resin, and a mixture of these resins. Further, these types of organic fluorescence colorants or organic fluorescent dyes (in the specification, these are collectively referred as organic fluorescence colorants) may be used solely, or two or more types of such colorants may be combined together in order to adjust hue of the fluorescence.

According to the present invention, 0.01 to 5 wt %, more preferably 0.1 to 2 wt %, of such an organic fluorescence colorant is contained with reference to a weight of a fluorescence color conversion film. When less than 0.01 wt % of the organic fluorescence colorant is contained, wavelength conversion will not be sufficient. When more than 5 wt % of the organic fluorescence colorant is contained, the color-conversion efficiency may be decreased due to an effect such as concentration quenching effect.

A matrix resin is a binder in the fluorescent colorant layers. That is, the matrix resin is a matrix material in which the fluorescent colorants are dispersed. The matrix resin used for the fluorescence color conversion filter layers is a photo-setting or photo- and thermo-setting resin. The matrix resin is cured optically and/or thermally to generate radicals or ion seeds to polymerize and cross-link, thereby obtaining a material that is not soluble and does not melt.

The photo-setting resin or photo- and thermo-setting resin includes (1) a composition containing an acrylic multifunctional monomer/oligomer having acroyl groups or methacroyl groups and a photo- or thermo-polymerization initiator, wherein the composition is optically or thermally treated to generate optical or thermal radicals for polymerization, (2) a composition containing polyvinyl ester cinnamate and a sensitizer, wherein the composition is optically or thermally treated to produce dimers for cross-linking, (3) a composition containing a linear or cyclic olefin and bisazido, wherein the composition is optically or thermally treated to generate nitrene to cross-link with the olefin, or (4) a composition containing monomers having an epoxy group and a photo oxidizer, wherein the composition is optically or thermally treated to generate acids (cations) for polymerization. In particular, the photo-setting resin or photo- and thermo-setting resin of (1) provides high resolution and easy pattern formation, as well as good durability such as solvent- and heat-resistance.

In the invention, the overcoat layer with gas barrier ability has high transparency in the visible region (transmittance of 50% or greater in a range of 400 to 700 nm), a Tg of 100° C. or higher, and a surface hardness of 2H or greater in terms of pencil hardness. The material is formed in a smooth coating film on the substrate, and does not affect the functionality of the color conversion filter layers 2 to 4. Such a material includes a photo-setting resin and/or a thermo-setting resin such as an imide modified silicone resin; a compound in which an inorganic metal (TiO, $Al_2O_3$, $SiO_3$, or the like) is dispersed in an acrylic, polyimide, silicone, or other resin; an epoxy-modified acrylatol resin used as an ultraviolet curable resin; a resin having reactive vinyl groups of acrylate monomer/oligomer/polymer; a resist resin; an inorganic compound formed by a sol-gel process; and a fluorine-based resin.

It is also possible to use an inorganic oxide or an inorganic nitride as the overcoat layer. A material is electrically insulating, has barrier ability against gases and organic solvents, and has high transparency in the visible region (transmittance of at least 50% in a range of 400 to 700 nm). For example, it is possible to use SiOx, SiNx, SiNxOy, AlOx, TiOx, TaOx, ZnOx, and the like.

The overcoat layer may be a single layer, or may be a laminate formed of a plurality of layers. In the case of a single layer, it is necessary that the single layer have a function of flattening a step in a pattern of the color conversion filter layers, and a function as a gas barrier layer relative to the organic EL luminous device. In the case of a laminate formed of a plurality of layers, it is possible to separate a layer having the function of flattening the step in the pattern of the color conversion filter layers, and a layer having the function as a gas barrier layer relative to the organic EL luminous device.

When such an overcoat layer is used in the color conversion type organic EL display, it is important to optimize a thickness of the overcoat layer for obtaining good display performance, in particular the viewing angle characteristic. The viewing angle characteristic is associated with a color change according to a viewing angle relative to the color conversion type organic EL display.

When the overcoat layer has a too large thickness, the excited light emitted from the organic EL layer needs to pass through a long optical path to reach the color conversion filter layers via the overcoat layer. As a result, when viewing the display with an angle, the excited light leaks to an adjacent pixel with a different color (i.e. optical cross-talk). In terms of the display performance of the display panel, it is necessary to minimize an amount of light emission from the adjacent pixel due to the optical cross-talk relative to an amount of light emission of the original color.

It is possible to control the optical cross-talk by adjusting a relationship between the thickness of the overcoat layer and the minimum pixel width. According to Journal of Technical Disclosure No. 2001-6083, it is preferable that the overcoat layer has a thickness t in a range of 0<t<0.1 W, where W is the minimum pixel width.

The supporting pillar is formed at an area between the pixels, and may be formed at any area outside the display region. The supporting pillar may have a circular cylindrical shape, a rectangular shape elongated along an edge of the pixel, or a # shape, but not limited thereto. The supporting pillar has a height corresponds to a gap between the organic EL luminous device substrate and the color conversion filter substrate when the two substrates are bonded together. It is preferred that the supporting pillar has a small height in a range of 0.5 to 5 µm for obtaining a wide viewing angle as far as the two substrates do not contact.

In the present invention, the overcoat layer may be formed on the stripping layer formed on the temporary substrate with dry method (sputtering, vapor deposition, CVD, etc.), wet method (spin coating, roll coating, casting, etc.), and the like. After the overcoat layer is bonded to the color conversion filter substrate using pressure or the like, the overcoat layer is transferred to the color conversion filter substrate by removing the stripping layer. Therefore, the method of the invention is different from the conventional method in which the overcoat layer is formed with the dry method or wet method directly on the color conversion filter substrate.

Further, in the invention, the supporting pillar female mold is formed in the temporary substrate or the stripping layer. Therefore, it is possible to form the projection as the supporting pillar simultaneously. In the transfer method of the invention, it is not necessary to consider thermal stability, chemical resistance and so on of the color conversion filter layer. Therefore, it is possible to use a wide rage of materials and methods for forming the overcoat layer. Moreover, it is possible to form the color conversion filter layer and the overcoat layer simultaneously, thereby reducing a lead time, and improving productivity and material utilization efficiency for forming the supporting pillar.

In the invention, the temporary substrate may be formed of a material such as silicon, silicon nitride, a glass, quartz, or a ceramic. The supporting pillar female mold may be formed in the temporary substrate with a method in which the temporary substrate is directly processed with a laser or the like, or a method in which an easy processing metallic material or the like is formed in a thin film on the temporary substrate, and the thin film is processed.

In the invention, the stripping layer may be formed of a metallic material such as chromium, nickel, tantalum or tungsten, an insulating material such as alumina or silicon dioxide, or IZO and the like. The stripping layer may be formed with vacuum deposition, vapor phase growth, sputtering or the like. The supporting pillar female mold may be formed in the stripping layer with photolithography or the like.

The temporary substrate and the stripping layer need to have flat surfaces, preferably with the maximum height difference of less than 0.1 μm, for obtaining a smooth surface of the overcoat layer.

The overcoat layer and the color conversion filter layer are bonded together at a pressure preferably in a range of 0.2 kgW/cm² to 2.0 kgW/cm², so that no void is formed in a bonding interface and a shape of the color conversion filter layer is maintained. The overcoat layer and the color conversion filter layer are bonded together at a temperature higher than 100° C. to remove moisture, organic solvent and so on, and lower than 200° C. not to degrade the colorants.

In the invention, the stripping layer formed of, for example, alumina may be removed with a solution of phosphoric acid as a principal component. The stripping layer formed of silicon dioxide may be removed with an etching solution containing hydrofluoric acid, and the stripping layer formed of IZO may be removed with hydrochloric acid.

In the case that the overcoat layer is formed of a plurality of layers as described earlier, it is possible to form the plurality of the layers on the temporary substrate before transferring the overcoat layer. Alternatively, it is possible to transfer some of the layers and then form the remainder of the layers thereupon.

In the invention, it is possible to provide an adhesive having an optical property similar to that of the overcoat layer between the overcoat layer and the color conversion filter layer. The adhesive is provided for improving adhesion between the overcoat layer and the color conversion filter layer, or for reducing voids between the overcoat layer and the color conversion filter layer. For example, in the case that the overcoat layer is formed of a material with a high viscosity and voids are easily generated between the overcoat layer and the color conversion filter layer, it is possible to solve the problem by providing an adhesive layer with a low viscosity.

According to the invention, the organic EL luminous device using the color conversion filter layer includes the color conversion filter layer and the organic EL luminous device. The organic EL luminous device emits light with a wavelength in the near-ultraviolet or visible region, preferably light with a wavelength in the blue or bluish-green region. The light is incident on the color conversion filter layer containing the fluorescence colorant layer. The light is then output from the color conversion filter layer as visible light with a different wavelength.

Note that depending on a configuration of the color conversion filter layer, the color conversion filter layer may not include the fluorescent colorant layer as described above. In that case, however, it is difficult to provide a display device in full color, and the configuration is not practical.

The organic EL luminous device has a structure in which the organic EL light-emitting layer is disposed between a pair of the electrodes. As needed, a hole-injection layer, a hole-transport layer and/or an electron-injection layer are interposed between the electrodes.

The luminous device may be composed of the following configurations.

(1) Positive electrode/organic light-emitting layer/negative electrode (2) Positive electrode/hole-injection layer/organic light-emitting layer/negative electrode (3) Positive electrode/organic light-emitting layer/electron-injection layer/negative electrode (4) Positive electrode/hole-injection layer/organic light-emitting layer/electron-injection layer/negative electrode (5) Positive electrode/hole-injection layer/hole-transporting layer/organic light-emitting layer/electron-injection layer/negative electrode In the layer configurations described above, it is preferred that at least one of the positive and negative electrodes is an electrode transparent to light with a wavelength emitted from the organic light-emitting layer. The emitted light is incident on the color conversion filter layer through the transparent electrode.

A material for each of the layers is well known. For example, in a case that the organic light-emitting layer emits light with a wavelength in the blue or bluish-green region, a material includes benzothiazole-, benzimidazole-, benzoxazole-based fluorescent whitening agent, a metal chelated oxonium compound, a styrylbenzene-based compound, and an aromatic dimethylidine compound.

EXAMPLE

Hereunder, an example of the top emission type multi-color organic EL display to which the manufacturing method of the present invention is applied will be described with reference to the drawings. FIG. 2 is a sectional view of the color conversion filter substrate. The color conversion filter layers 2, 3 and 4 each containing red, green and blue dye(s) or pigment(s) are formed in a pattern on the transparent supporting substrate 1 with the photolithography. The overcoat layer 5 and supporting pillars 16 are formed on the color conversion filter layers. FIG. 1 is a sectional view showing the top emission type multi-color organic EL display to which the present invention is applied.

A blue filter material (a product of Fuji Hunt Electronics Technology; Color Mosaic CB-7001) was applied onto a sheet of Corning glass as the transparent supporting substrate 1 with the spin coating method. The layer was patterned with the photolithography method, thereby obtaining a stripe pattern of the blue color conversion filter layer 4 with a thickness of 10 μm, a line width of 0.1 mm and a line pitch of 0.33 mm.

0.7 parts by weight of Coumarin 6 as a fluorescent colorant was dissolved in 120 parts by weight of a propylene glycol monoethyl acetate (PGMEA) solvent. 100 parts by weight of a photo setting resin 'V259PA/P5' (a product of Nippon Steel Chemical Co., Ltd.) was added to the solution and dissolved, thus obtaining a coating liquid. The coating liquid was applied with the spin coating method onto the transparent supporting substrate 1 on which the stripe pattern of the blue color conversion filter layer 4 was formed. The coating liquid was patterned with the photolithography method, thereby obtaining a stripe pattern of the green color conversion filter layer 3 with a thickness of 10 μm, a line width of 0.1 mm and a line pitch of 0.33 mm.

0.6 parts by weight of Coumarin 6, 0.3 parts by weight of Rhodamine 6G and 0.3 parts by weight of Basic Violet 11 as fluorescent colorants were dissolved in 120 parts by weight of a propylene glycol monoethyl acetate (PGMEA) solvent. 100 parts by weight of the photo setting resin 'V259PA/P5' (a product of Nippon Steel Chemical Co., Ltd.) was added to the solution and dissolved, thereby obtaining a coating liquid. The coating liquid was applied with the spin coating method onto the transparent supporting substrate 1 on which the stripe patterns of the blue color conversion filter layer 4 and the green color conversion filter layer 3 were formed. The coating liquid was then patterned with the photolithography method, thereby obtaining a stripe pattern of the red color conversion filter layer 2 with a thickness of 10 μm, a line width of 0.1 mm and a line pitch of 0.33 mm.

IZO was deposited as the stripping layer 13 with a thickness of 2 μm on the whole surface of a sheet of Corning 1737 glass (a product of Corning) as the temporary substrate 12 with the sputtering method. A supporting pillar female mold was patterned in the stripping layer 13 with the photolithography method. IZO was further deposited to form a layer with a thickness of 0.2 μm with the sputtering method. Accordingly, as shown in FIG. 3, the stripping layer 13 having the supporting pillar female mold therein was formed on the temporary substrate 12.

An acrylic transparent resin (NN810, made by JSR) was applied onto the stripping layer 13 as the overcoat layer 5 with a thickness of 10 μm with the spin coating method. The overcoat layer was patterned to cover upper surfaces and peripheral areas of the color conversion filter layers and gaps between the color conversion filter layers with the photolithography method. As shown in FIG. 6, the overcoat layer 5 on the temporary substrate 12 was bonded to the color conversion filter layers 2, 3 and 4 on the transparent supporting substrate 1 at 80° C. and 0.5 kgW/cm². The bonded substrates were held at the same pressure and 160° C. for 30 minutes for curing the overcoat layer 5. Then, the stripping layer 13 was etched using hydrochloric acid, thereby transferring the overcoat layer 5 to the color conversion filter substrate as shown in FIG. 7. At this time, the supporting pillars 16 were formed simultaneously. After the transfer, SiOxNy was deposited to form the second overcoat layer with a thickness of 300 nm with the sputtering method (not shown in the drawings).

The second overcoat layer was formed on the overcoat layer on which the supporting pillars were formed. Accordingly, there may be a risk that the supporting pillars have a curved shape. However, in the present example, the supporting pillars have a height of 2 μm, and the second overcoat layer has a much smaller thickness of 0.3 μm. Further, the second overcoat layer was formed with the sputtering method. Therefore, there is little possibility that the supporting pillars have the shape changed to the extent of losing their function.

In the example, the overcoat layer (laminate) had a thickness of 5.2 μm at the area of the color conversion filter layers, and the maximum height difference of the surface was 0.2 μm. It was found that the patterns of the color conversion filter layers were not deformed upon forming the overcoat layer.

As shown in FIG. 1, the bottom gate type TFTs 15 were formed on a sheet of Corning 1737 glass (a product of Corning) as the substrate 14, and the sources of the TFTs were connected to the anodes 17. The anodes 17 included IZO (InZnO) on an upper surface thereof, and Al at a lower portion thereof connected to the source of the TFT via a contact hole (not shown) formed in an insulating film on the TFT.

The Al film is provided for reducing an electrical resistance, and for reflecting the light emitted from the light-emitting layer so that the light is emitted efficiently from the top. The Al film had a thickness of 300 nm. The IZO on the upper surface has a high work function, and hence was provided for efficiently injecting holes into the light-emitting layer. The IZO had a thickness of 200 nm.

A hole injection layer 7, a hole transport layer 8, an organic EL light-emitting layer 9, and an electron injection layer 10 were deposited on the anode 17 in this order without releasing the vacuum. The materials used in the respective layers have chemical structures shown in Table 1.

TABLE 1

| Layer | Material | Chemical Structure |
|---|---|---|
| Hole injection layer | Copper phthalocyanine | 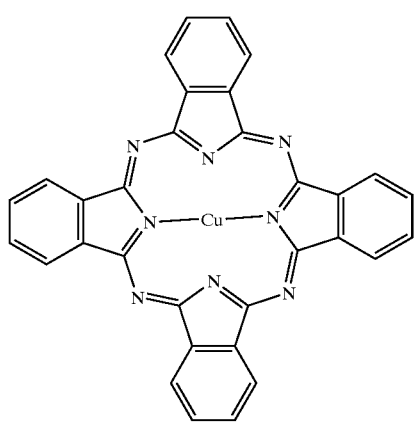 |

TABLE 1-continued

| Layer | Material | Chemical Structure |
|---|---|---|
| Hole transport layer | 4,4'-bis[N-(1-naphthyl)-N-phenylamino]biphenyl | |
| Light-emitting layer | 4,4'-bis(2,2-diphenylvinyl)biphenyl | |
| Electron injection layer | Tris(8-hydroxyquinoline) aluminum complex | |

An inside pressure of the vacuum chamber was reduced down to $1\times10^{-4}$ Pa during the deposition. Copper phthalocyanine (CuPc) was deposited to form the hole injection layer 7 with a thickness of 100 nm. 4,4'-bis[N-(1-naphthyl)-N-phenylamino]biphenyl (α-NPD) was deposited to form the hole transport layer 8 with a thickness of 20 nm. 4,4'-bis(2,2-diphenylvinyl)biphenyl (DPVBI) was deposited to form the light-emitting layer 9 with a thickness of 30 nm. An aluminum chelate (Alq) was deposited to form the electron injection layer 10 with a thickness of 20 nm. Finally, the transparent cathode 18 was formed using a metal mask without releasing the vacuum.

The transparent cathode 18 was formed by depositing metallic Mg/Ag, which has a low work function required for the electron injection, to have a thickness of 2 nm with the co-deposition method, and then an IZO film with a thickness of 200 nm was deposited thereon with the sputtering method.

The color conversion filter substrate and the organic EL luminous device substrate obtained as described above were sealed together with the UV-curing sealing resin 19 under a dry nitrogen atmosphere (oxygen and moisture concentration of lower than 10 ppm) in a glove box. The two substrates contacted with each other only at the supporting pillars and the sealing resin, and a state of the sealing was good.

The brightness distribution and the viewing angle were evaluated for the display panel manufactured in the example described above. The brightness distribution was found to be within 2% over the panel surface, and the viewing angle was approximately 160° in the horizontal direction, and approximately 150° in the vertical direction.

The pixel defect was evaluated after the organic EL display was driven for 500 hours in a high-temperature environment at 85° C. It was found that no pixel defect was observed. A change in dark spots on the light-emitting surface was also evaluated. It was found that the organic EL display manufactured using the manufacturing method of the present invention showed no generation and growth of the dark spots.

As described above, according to the present invention, the supporting pillars and the overcoat layer are integrally formed as a single body on the color conversion filter layer by transfer. Therefore, it is possible to efficiently manufacture the multi-color organic EL display with the excellent display performance.

While the invention has been explained with reference to the specific embodiments of the invention, the explanation is illustrative and the invention is limited only by the appended claims.

What is claimed is:

1. A method of manufacturing an organic EL display, comprising the steps of:
   preparing an organic EL device substrate,
   preparing a combination of a transparent substrate and color conversion filter layers,
   foaming an overcoat layer with a pillar in a pillar mold formed by a stripping layer and a temporary substrate, attaching the overcoat layer with the pillar formed in the pillar mold to the combination of the transparent substrate and the color conversion filter layer while curing the overcoat layer with the pillar at a predetermined temperature, removing the stripping layer to detach the temporary substrate from the overcoat layer with the pillar, and attaching the overcoat layer with the pillar attached to the combination of the transparent substrate and the color conversion filter layers to the organic EL device substrate.

2. A method of manufacturing an organic EL display according to claim 1, wherein said organic EL device substrate includes a substrate, a thin film transistor formed on the substrate, first electrodes formed on the thin film transistor, organic EL light-emitting layers formed on the first electrodes, and a second electrode formed on the organic EL light-emitting layers.

3. A method of manufacturing an organic EL display according to claim 2, wherein said pillar has a predetermined length so that the overcoat layer is apart from the second electrode in the organic EL luminous device substrate by a predetermined gap when the overcoat layer with the pillar attached to the combination of the transparent substrate and the color conversion filter layer is attached to the organic EL luminous device substrate.

4. A method of manufacturing an organic EL display according to claim 3, wherein said overcoat layer has a gas barrier property and is covered on the color conversion filter layers formed on the transparent substrate to smoothen surfaces of the color conversion filter layers.

5. A method of manufacturing an organic EL display according to claim 1, wherein said pillar mold is formed by the temporary substrate with a female mold for the pillar, and the stripping layer is deposited on the temporary substrate.

6. A method of manufacturing an organic EL display according to claim 1, wherein said pillar mold is formed by the temporary substrate and the stripping layer with a female mold for the pillar.

7. A method of manufacturing an organic EL display according to claim 1, wherein said overcoat layer with the pillar is cured at a temperature equal to or lower than 200° C.

8. A method of manufacturing an organic EL display according to claim 1, wherein said overcoat layer includes a first overcoat layer having the pillar and smoothening surfaces of the color conversion filter layers, and a second overcoat layer laminated with the first overcoat layer and having a gas barrier property.

9. A method of manufacturing a color conversion filter substrate, comprising the steps of:

preparing a combination of a transparent substrate and color conversion filter layers, forming an overcoat layer with a pillar in a pillar mold formed by a stripping layer and a temporary substrate, attaching the overcoat layer with the pillar formed in the pillar mold to the combination of the transparent substrate and the color conversion filter layer while curing the overcoat layer with the pillar at a predetermined temperature, and removing the stripping layer to detach the temporary substrate from the overcoat layer with the pillar.

10. A method of manufacturing a color conversion filter substrate according to claim 9, wherein said pillar mold is formed by the temporary substrate with a female mold for the pillar, and the stripping layer is deposited on the temporary substrate.

11. A method of manufacturing a color conversion filter substrate according to claim 9, wherein said pillar mold is formed by the temporary substrate and the stripping layer with a female mold for the pillar.

12. A method of manufacturing a color conversion filter substrate according to claim 9, wherein said overcoat layer with the pillar is cured at a temperature equal to or lower than 200° C.

13. A method of manufacturing a color conversion filter according to claim 9, wherein said overcoat layer includes a first overcoat layer having the pillar and smoothening surfaces of the color conversion filter layers, and a second overcoat layer laminated with the first overcoat layer and having a gas barrier property.

* * * * *